United States Patent [19]

Tanaka et al.

[11] Patent Number: 5,017,984
[45] Date of Patent: May 21, 1991

[54] AMORPHOUS SILICON THIN FILM TRANSISTOR ARRAY

[75] Inventors: Sakae Tanaka; Yoshiaki Watanabe, both of Tokyo, Japan

[73] Assignee: Seikosha Co., Ltd., Tokyo, Japan

[21] Appl. No.: 533,994

[22] Filed: Jun. 4, 1990

Related U.S. Application Data

[63] Continuation of Ser. No. 311,304, Feb. 15, 1989, abandoned.

[30] Foreign Application Priority Data

Feb. 29, 1988 [JP] Japan ................................ 63-46424

[51] Int. Cl.⁵ .................... H01L 29/78; H01L 45/00; H01L 27/12; H01L 23/48
[52] U.S. Cl. ...................................... 357/23.7; 357/2; 357/4; 357/71
[58] Field of Search ...................... 357/23.15, 23.7, 2, 357/71, 4

[56] References Cited

U.S. PATENT DOCUMENTS

| 4,404,578 | 9/1983 | Takafaji et al. | 357/23 |
| 4,778,258 | 10/1988 | Parks et al. | 350/336 |
| 4,816,885 | 3/1989 | Yoshida et al. | 357/23.7 |
| 4,821,092 | 4/1989 | Noguchi | 357/4 |

Primary Examiner—Andrew J. James
Assistant Examiner—Stephen D. Meier
Attorney, Agent, or Firm—Jordan and Hamburg

[57] ABSTRACT

An amorphous silicon thin film transistor array substrate has a gate insulating layer and an amorphous silicon layer formed on gate wiring. A pattern of a protective insulating layer having a stepped edge is formed on the amorphous silicon layer. An upper electrode of the same material as the source electrode and the drain electrode are formed on the protective insulating layer to cover the stepped edge of the protective insulating layer. A hold capacitance is formed by connecting the upper electrode to a pixel electrode on the substrate.

5 Claims, 8 Drawing Sheets 5,017,984

AMORPHOUS SILICON THIN FILM TRANSISTOR ARRAY

This application is a continuation of U.S. application Ser. No. 311,304, filed Feb. 15, 1989, now abandoned.

FIELD OF THE INVENTION

The present invention relates to an amorphous silicon (in the following, referred to as a-Si) thin film transistor (in the following, referred to as TFT) array substrate.

BACKGROUND OF THE INVENTION

In recent years, a liquid crystal matrix display device, especially a so-called active matrix type liquid crystal display device provided with a switching element for each pixel, has been under research and development at various facilities for use as a thin picture image display device. An MIS-type TFT is generally used as the switching element.

FIG. 7 shows a known electric circuit diagram of an active matrix type liquid crystal display device.

In the gate wiring 2, for example, when Xi is selected, the TFT 21 connected thereto conducts, and picture image signals are transmitted to the picture element electrode 9 through the source wiring 13 and the TFT 21. To the liquid crystal layer 22 is applied the electric voltage difference between the pixel electrode 9 and the counter electrode 24 provided on the substrate counterposed thereto, putting the liquid crystal layer therebetween, and the optical transparency of the liquid crystal layer 22 is changed by this voltage difference and a display is produced. After the TFT 21 has been turned off, the voltage of the pixel electrode 9 is held until the same TFT 21 is selected for the next time, by the capacitance component of the liquid crystal layer 22 itself and the hold capacitance 23 between the picture element electrode 9 and the Xi-1 in the gate wiring 2. The hold capacitance 23 is provided since the voltage of the pixel electrode 9 is lowered by leakage current in the period when the TFT 21 is turned off when only the capacitance of the liquid crystal layer 22 is provided.

In FIGS. 8 to 10 further illustrating the prior art, numeral 1 denotes an insulating substrate, 2 a gate wiring, 3 a gate insulating layer, 4 an amorphous silicon layer, 5 a protective insulating layer, 7 an n-type silicon layer provided for the ohmic contact, 8 a metal layer, 9 a pixel electrode, 10 a source electrode, 11 a drain electrode, 12 a gate electrode, and 13 a source wiring. As can be seen in FIGS. 8 and 10 the hold capacitance is formed between the gate wiring 2 and the pixel electrode 9 by putting the gate insulating layer 3, the amorphous silicon layer 4 and the protective insulating layer 5 therebetween.

In FIG. 9, the thickness of the amorphous silicon layer 4 is about 50 nm, and the thickness of the protective insulating layer 5 is about 400 nm, and when both thickness are totaled, a thickness of about 450 nm is obtained. The ITO exclusively used as the pixel electrode 9 renders it difficult to cover a step difference of 450 nm well, and produces cutting in step 9a, and as a result, a defect occurs since the hold capacitance was electrically separated from the pixel electrode.

SUMMARY OF THE INVENTION

The present invention is directed to a solution of the above-described problem of conventional devices, and has the object of ensuring that the capacitance is not electrically separated from the electrode.

DESCRIPTION OF THE PREFERRED EMBODIMENTS

Figure 1:
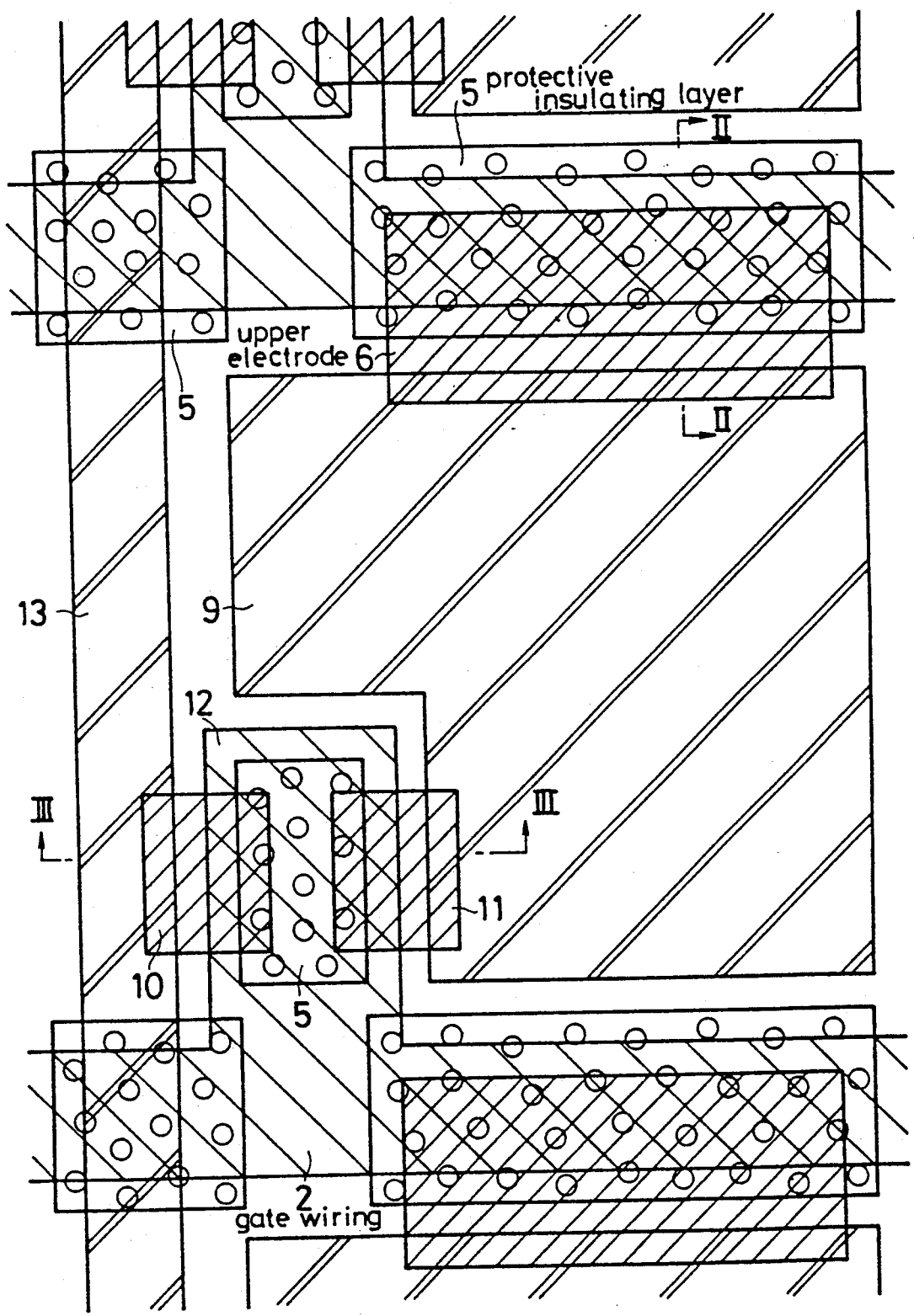
FIG. 1 is a plan diagram showing an embodiment of the present invention.

In the following disclosure, four embodiments of the present invention will be explained by referring to the drawings.

In FIGS. 1 to 3, numeral 1 denotes an insulating substrate, 2 a gate wiring, 3 a gate insulating layer, 4 an amorphous silicon layer, 5 a protective insulating layer, 6 an upper electrode, 7 an n-type silicon layer, 8 a metal layer, 9 a pixel electrode, 10 a source electrode, 11 a drain electrode, 12 a gate electrode, and 13 a source wiring.

In the following disclosure an explanation will be given of the production process for obtaining the structure shown in the above-described embodiment, by referring to FIGS. 2(a)-2(c) and 3(a)-3(c).

Figure 2A:
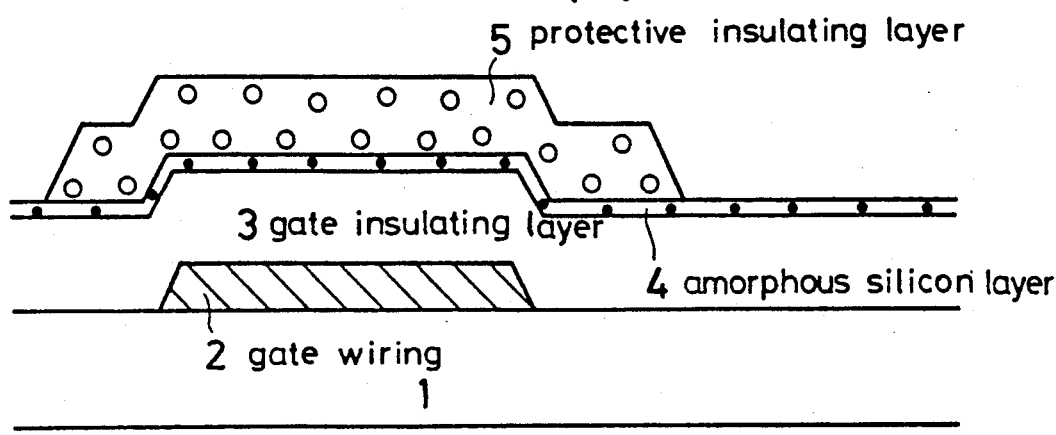
FIGS. 2(a)-2(c) are sectional diagrams taken along the line II—II in FIG. 1 for three sequential process steps in accordance with the invention.
Figure 3A:
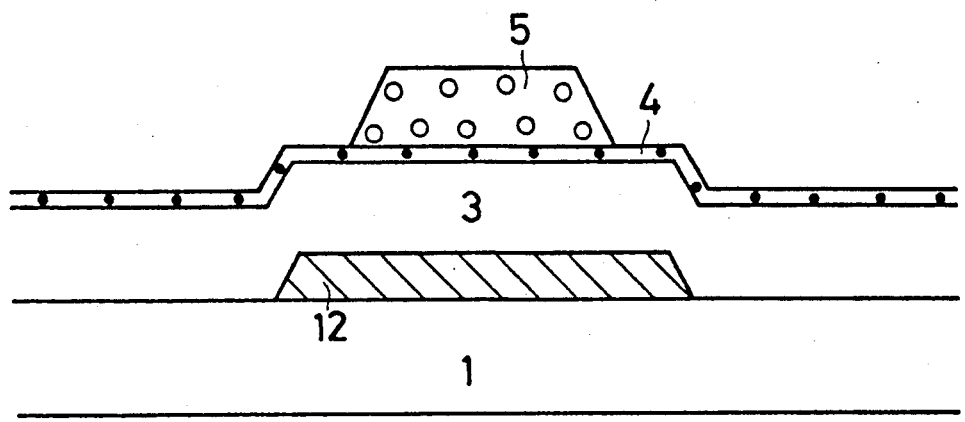
FIGS. 3(a)-3(c) are sectional diagrams taken along the line III—III in FIG. 1 for three sequential process steps in accordance with the invention.

In FIGS. 2(a) and 3(a), an insulating substrate 1 is provided with a gate electrode 12 (FIG. 3(a)) and gate wiring 2 (FIG.2(a)). A gate insulating layer 3 is formed thereon of silicon nitride to 400 nm, followed by an amorphous silicon layer of 4 to 50 nm, and a protective insulating layer 5 of silicon nitride to 400 nm, by a plasma CVD method, and the protective insulating layer 5 is selectively removed by a buffer fluoric acid solution.

Figure 2B:
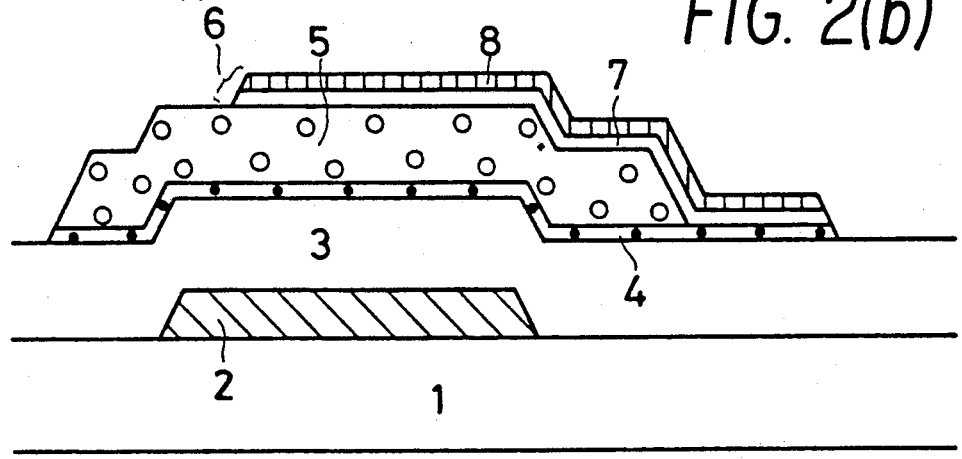
Figure 3B:
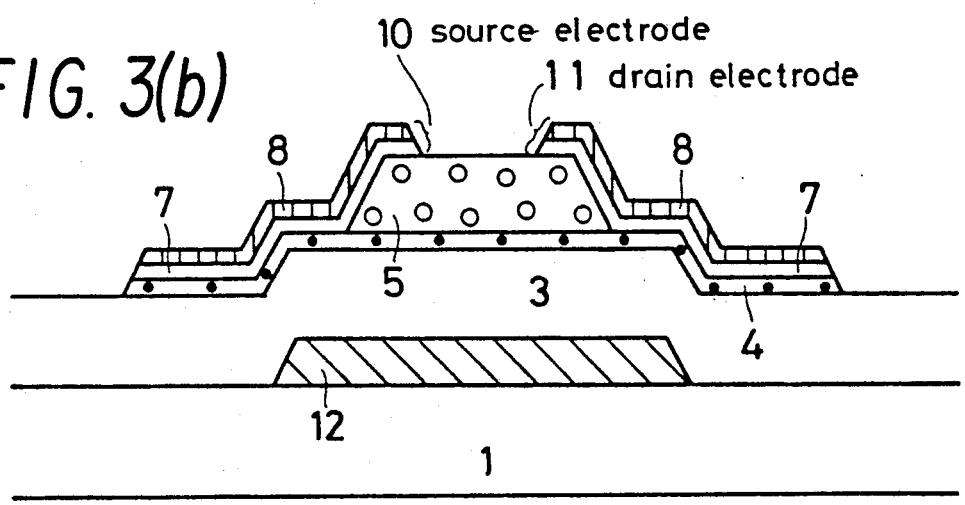

In FIGS. 2(b) and 3(b), an n-type silicon layer 7 is formed to 50 nm by the plasma CVD method, and successively, a metal layer 8 is formed to 50 nm by the vacuum evaporation method, and this metal layer 8 is patterned into the shapes of the source electrode and drain electrode. Using the patterned metal layer 8 and protective insulating layer as the mask, the n-type silicon layer 7 and amorphous silicon layer 4 are removed by an organic alkalinic solution, and a source electrode 10, a drain electrode 11 and an upper electrode 6 of the hold capacitance are formed.

Figure 2C:
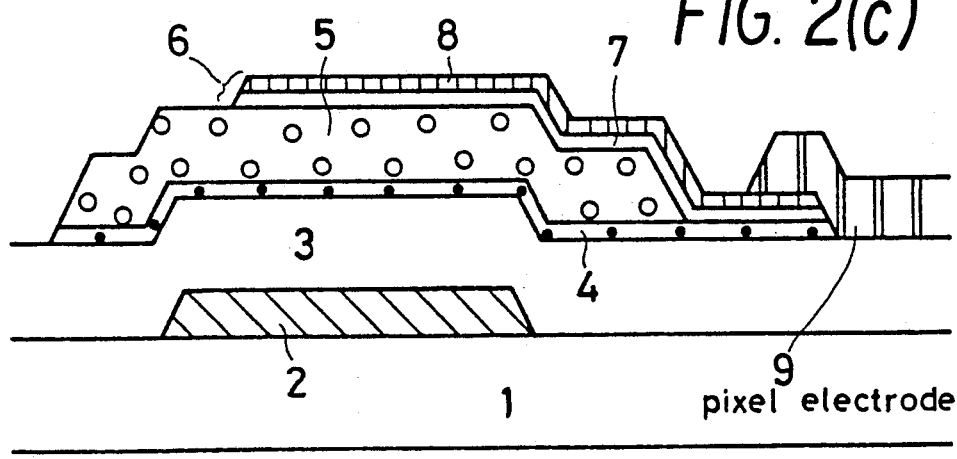
Figure 3C:
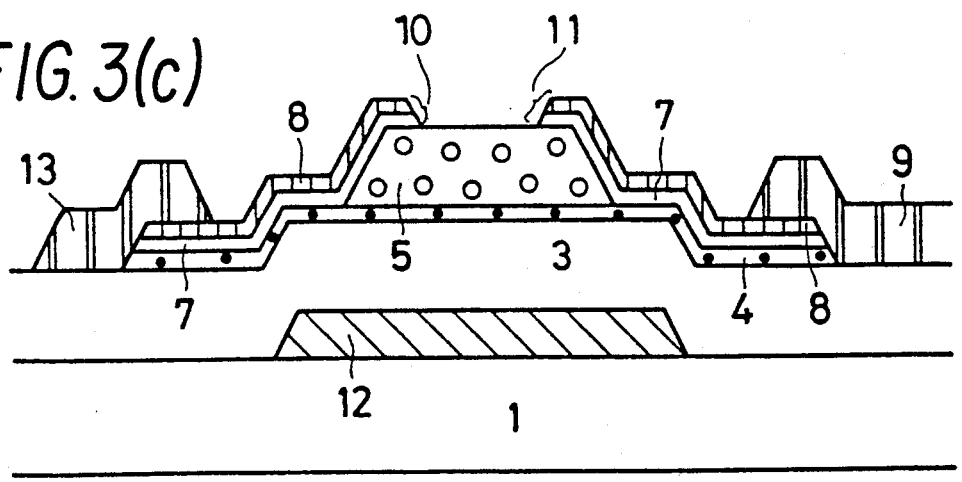

In FIGS. 2(c) and 3(c), the ITO is formed by the vacuum evaporation method, and this is selectively removed by a ferric chloride solution to form a pixel electrode 9 and a source wiring 13 (FIG. 3(c)).

As apparent from the above-described explanation, the upper electrode 6 of the hold capacitance is formed of the same substance as the source electrode 10 and the drain electrode 11, that is, by the n-type silicon layer 7 and metal layer 8. Especially since the n-type silicon layer 7 is a conductive substance excellent in step covering property, it can cover the step of the protective insulating layer 5 with good covering property. On the other hand, concerning the connection between the picture element electrode 9 and the upper electrode 6, since the pixel electrode is required to cover only the step difference of 150 nm by the above-described three layers of the amorphous silicon layer 4 (50 nm), n-type silicon layer 7 (50 nm), and metal layer (50 nm), there is almost no possibility of the occurrence of step separation.

From the above-described two points, electrical separation between the pixel electrode 9 and the upper electrode 6 can be made almost nil.

There is the possibility of the occurrence of defective insulation between the upper electrode 6 and the gate wiring 2, and especially, in the neighbourhood of the edge part of the gate wiring, since the electric field concentrates at this location, and dust is likely to accumulate here. The probability of the occurrence of defective insulation at this location is overwhelmingly high in comparison to other places.

Figure 4:
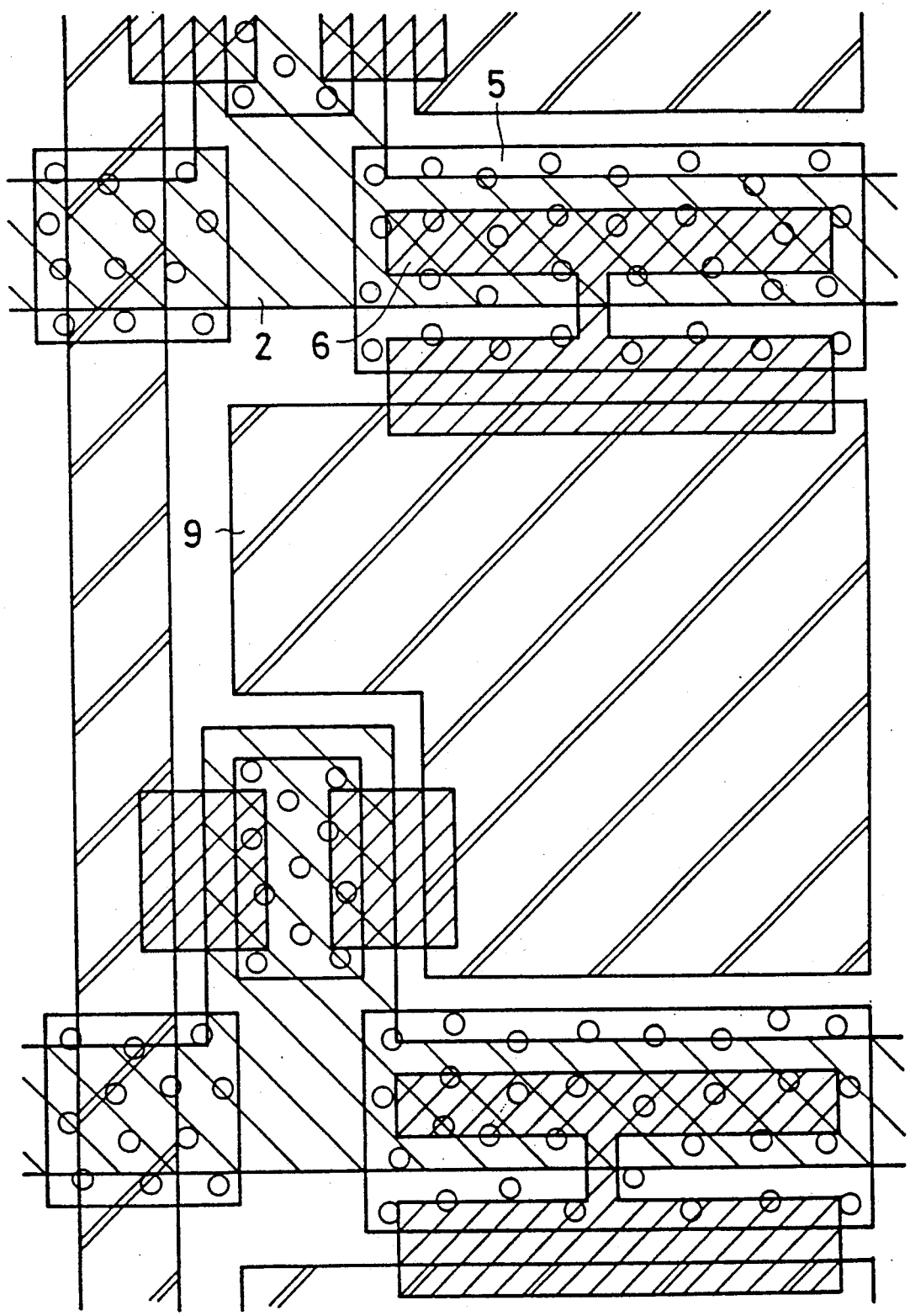
FIG. 4 is a plan diagram showing the second embodiment of the present invention.

FIG. 4 shows the second embodiment of the present invention, that is provided as a countermeasure for the above-described defective insulation. That is, at the place where the upper electrode traverses the edge part of the gate wiring, the upper electrode is narrowed in its width to have an H-letter shape. From such improvement, the probability of the occurrence of the defective insulation in the neighbourhood of the edge part of the gate wiring 2 is reduced to a large extent.

Figure 5:
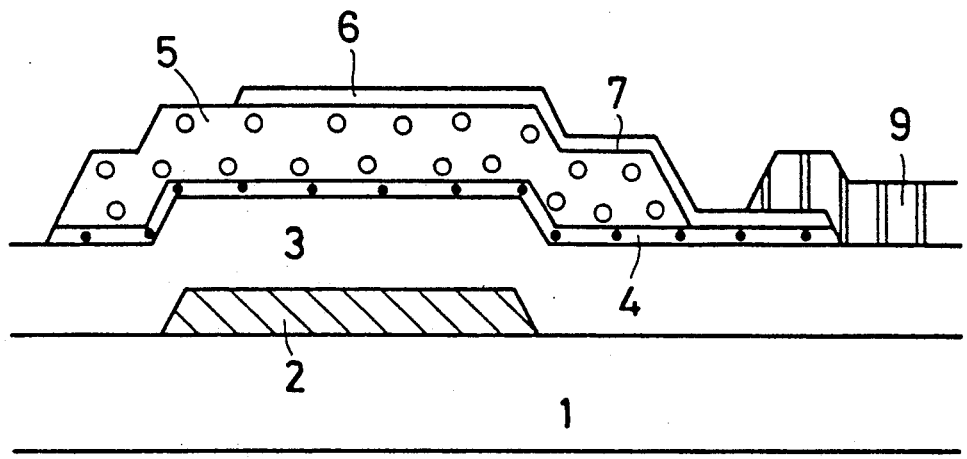
FIG. 5 is a sectional diagram showing the third embodiment of the present invention.

FIG. 5 shows the third embodiment of the present invention. In this embodiment, the upper electrode 6 is formed of the n-type silicon layer 7 only, and as a result, the step to be covered by the pixel electrode 9 becomes equal to 100 nm formed by the two layers, the amorphous silicon layer 4 (50 nm) and the n-type silicon layer 7 (50 nm).

Figure 6:
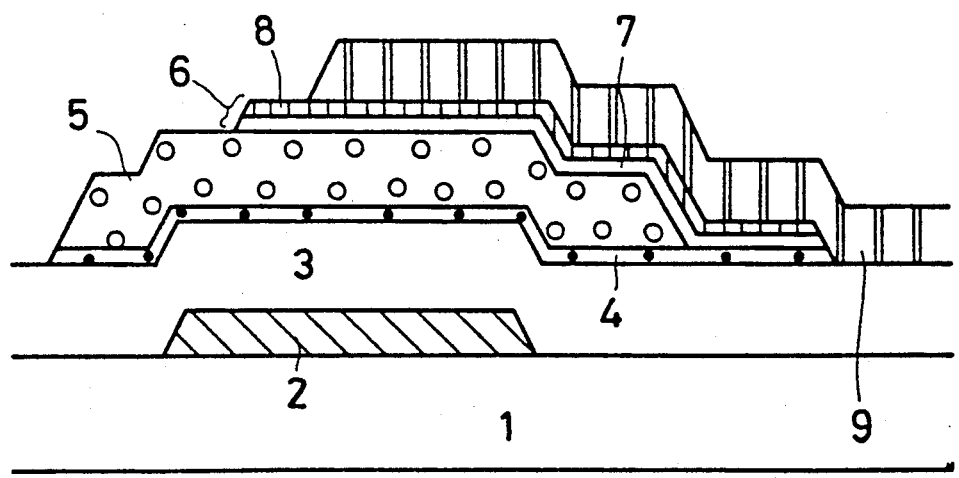
FIG. 6 is a sectional diagram showing the fourth embodiment of the present invention.
Figure 7:
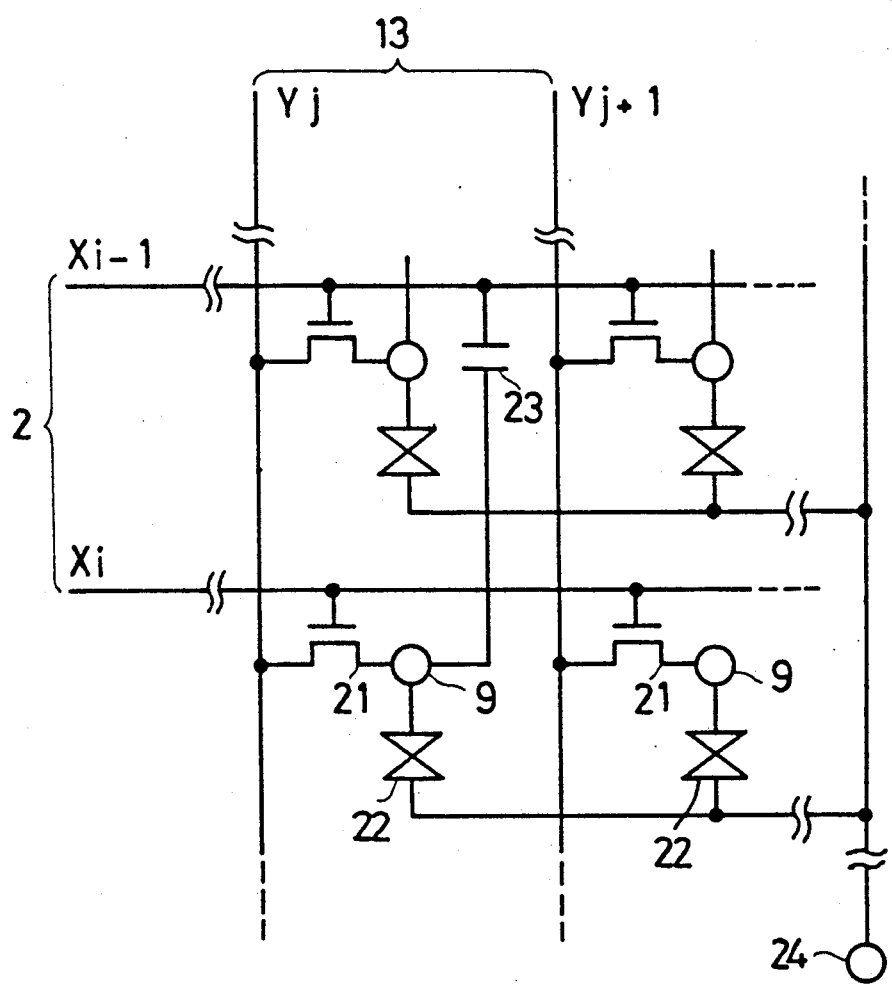
FIG. 7 is an electric circuit diagram showing the construction of the active matrix type liquid crystal display device.
Figure 8:
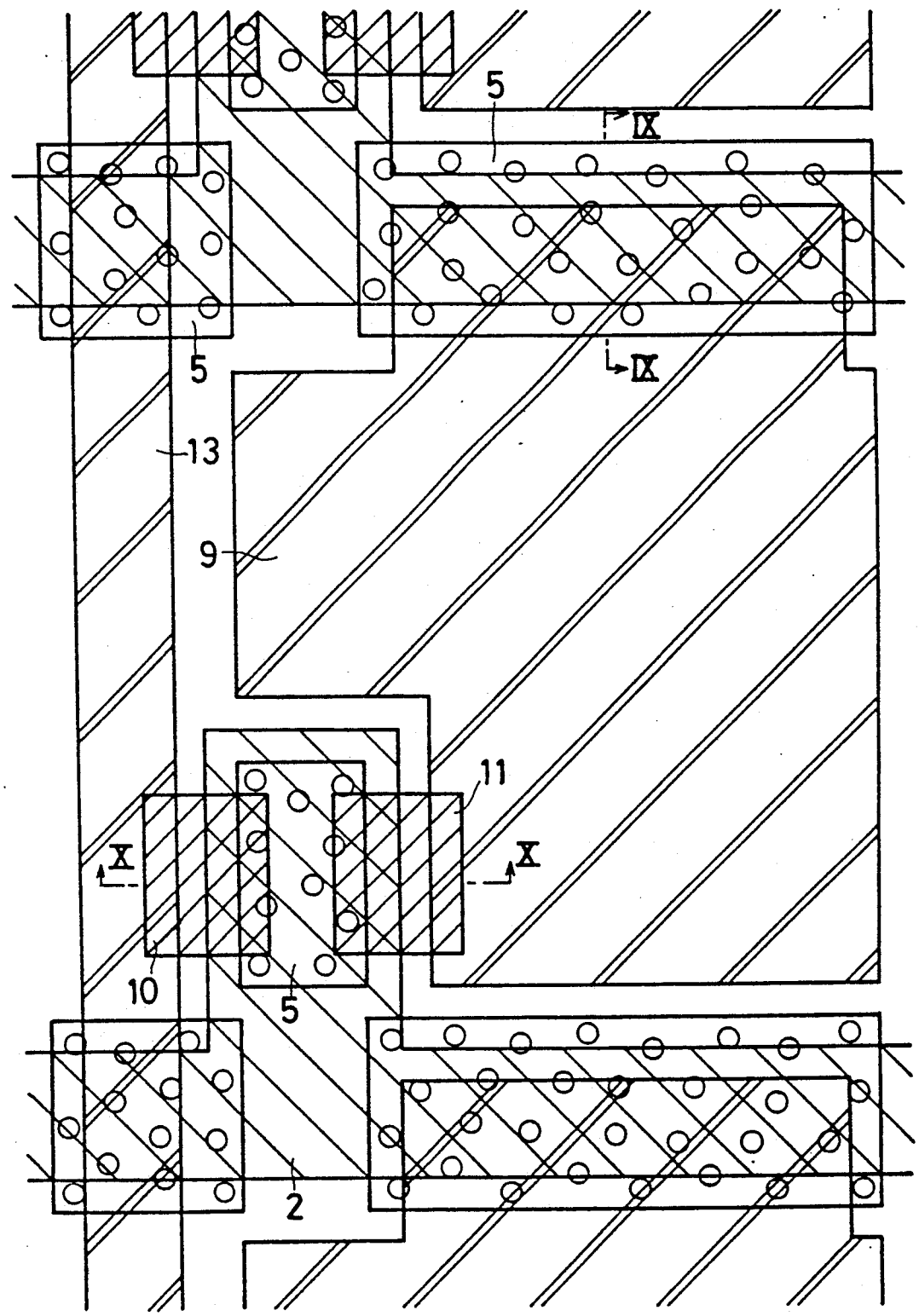
FIG. 8 is a plan diagram showing one example of the conventional structure.
Figure 9:
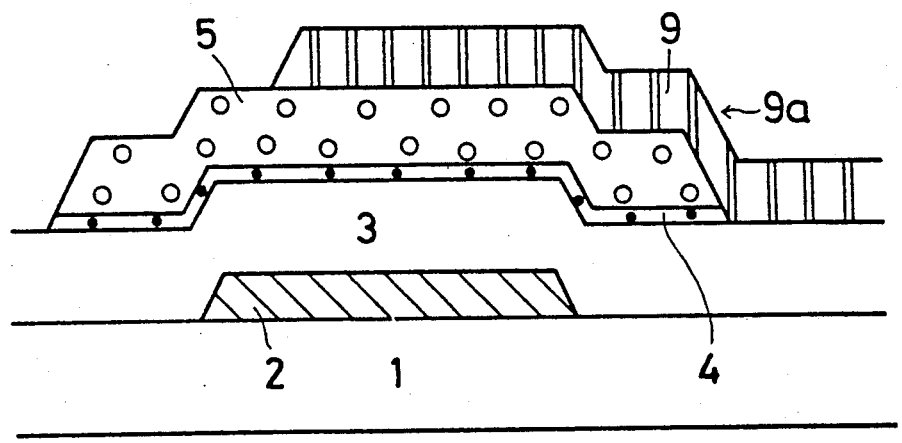
FIG. 9 is a sectional diagram taken along the line IX—IX in FIG. 8.
Figure 10:
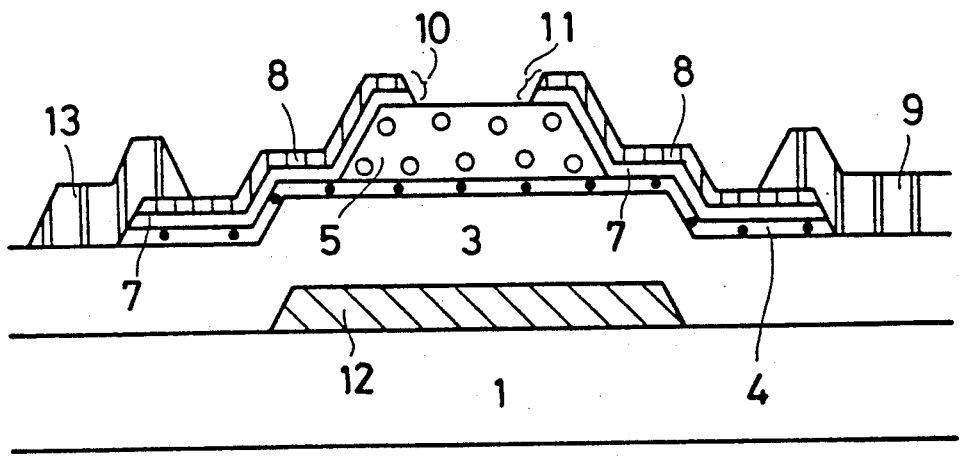
FIG. 10 is a sectional diagram taken along the line X—X in FIG. 8.

FIG. 6 shows the fourth embodiment of the present invention. As shown in this Figure, the pixel electrode 9 has no material to be formed in such a manner as to overlap the gate wiring 2. Even if the pixel electrode 9 has step separation at the step of the protective insulating layer 5, the connection to the upper electrode 6 is guaranteed by the edge part of the upper electrode.

According to the present invention, since the upper electrode having a good covering property for the step covers the step with the protective insulating layer, and a pixel electrode is connected to this upper electrode, step separation is not formed at the step of the protective insulating layer, and electric separation of the hold capacitance from the pixel electrode does not occur. The yield can therefore be improved to a large extent.

Further, when the upper electrode is narrowed in width at the place where it transverses the gate wiring, the insulation breakdown in the neighbourhood of the edge part of the gate wiring is reduced to a large extent, and increased improvement of the yield can be expected.

In addition, since the upper electrode is formed of the same substance as the source electrode and the drain electrode, it may be formed by the change of the mask pattern only, in contrast to the conventional example, and no increase of the production process occurs.

Also, by forming the upper electrode with the n-type silicon layer only, the step which the pixel electrode covers is reduced an the possibility of the occurrence of step separation becomes extremely small.

We claim:

1. An amorphous silicon thin film transistor array substrate comprising:
    a plurality of amorphous silicon thin film transistors on a substrate, each of said amorphous silicon thin film transistors having at least a gate, a source electrode and a drain electrode,
    a gate wiring on said substrate interconnecting said gates, said gate wiring forming a first electrode of a hold capacitance,
    a gate insulating layer on said gate wiring,
    an amorphous silicon layer on said gate insulating layer,
    a protective insulating layer having an edge that defines a step due to the thickness thereof, said protective insulating layer being located on said amorphous silicon layer,
    an upper electrode on said protective insulating layer and covering said step, said upper electrode consisting of at least an n-type silicon layer and forming a second electrode of said hold capacitance, and
    a pixel electrode connected to said upper electrode and to one of the electrodes of one of said transistors, said pixel electrode being of a material different from said upper electrode, said capacitance being formed substantially solely by said gate wiring and said upper electrode.

2. An amorphous silicon thin film transistor array substrate comprising:
    a plurality of amorphous silicon thin film transistors on a substrate, each of said amorphous silicon thin film transistors having at least a gate, a source electrode and a drain electrode,
    a hold capacitance,
    a gate wiring on said substrate interconnecting said gates, a portion of said gate wiring defining a first electrode of said hold capacitance,
    a gate insulating layer on said portion of said gate wiring,
    an amorphous silicon layer on said gate insulating layer overlaying said portion of said gate wiring,
    a protective insulating layer having an edge that defines a step due to the thickness thereof, said protective insulating layer being located on said amorphous silicon layer with a portion thereof overlying said portion of said gate wiring and with said step displaced from alignment with said portion of said gate wiring,
    an upper electrode on said protective insulating layer and covering said step, said upper electrode consisting of at least an n-type silicon layer, a portion of said upper electrode being aligned with said portion of said gate wiring and forming a second electrode of said hold capacitance, and
    a pixel electrode connected to said upper electrode, said pixel electrode being of a material different from said upper electrode, said capacitance being formed substantially solely by said gate wiring and said upper electrode, the connection between the pixel electrode and upper electrode constituting the only direct electrical connection to said upper electrode.

3. The amorphous silicon thin film transistor array substrate of claim 2 wherein a portion of said pixel electrode overlays a portion of said upper electrode.

4. The amorphous silicon thin film transistor array substrate of claim 3 wherein said portion of said pixel electrode is displaced from said step.

5. The amorphous silicon thin film transistor array substrate of claim 3 wherein a further portion of said pixel electrode overlays a portion of said one of said electrodes of one of said transistors.

* * * * *